United States Patent [19]

Knowlton

[11] Patent Number: 4,802,024
[45] Date of Patent: Jan. 31, 1989

[54] VIDEO REPRODUCTION APPARATUS HAVING AUTOMATIC BLACK AND WHITE CALIBRATION

[75] Inventor: James R. Knowlton, Encinitas, Calif.

[73] Assignee: Eastman Kodak Company, Rochester, N.Y.

[21] Appl. No.: 929,574

[22] Filed: Nov. 12, 1986

[51] Int. Cl.$^4$ .............................................. H04N 5/78
[52] U.S. Cl. ................................. 360/36.1; 360/9.1; 360/27
[58] Field of Search ..................... 360/9.1, 33.1, 36.1, 360/27; 358/171

[56] References Cited

U.S. PATENT DOCUMENTS

| | | | |
|---|---|---|---|
| 3,582,545 | 6/1971 | Thorpe | 358/171 |
| 4,366,501 | 12/1982 | Tsunekawa et al. | 358/310 |
| 4,369,466 | 1/1983 | Matsuzaki et al. | 358/171 X |
| 4,396,950 | 8/1983 | Roth | 358/213 |
| 4,418,362 | 11/1983 | Nadler | 358/293 |
| 4,496,995 | 1/1985 | Colles et al. | 360/9.1 |
| 4,529,886 | 7/1985 | Yokoyama et al. | 250/578 |
| 4,700,239 | 10/1987 | Yoshinaka et al. | 360/27 X |

FOREIGN PATENT DOCUMENTS 3756685 11/1985 Japan .

Primary Examiner—Aristotelis M. Psitos
Attorney, Agent, or Firm—William F. Noval

[57] ABSTRACT

Video reproduction apparatus in which a plurality of parallel channels of frequency modulated video information signals reproduced from magnetic tape are automatically calibrated during demodulation to constrain each video information signal between the same peak to peak black and white analog signal range. The demodulator for each video channel includes a circuit for comparing demodulated white and black reference level signals at the beginning of the reproduced video signal with fixed white and black reference levels. White and black correction signals are produced which are representative of any differences between the reproduced and fixed reference level signals. The white and black correction signals are applied to the demodulator during demodulation of the video information signal to constrain the analog video signal between the fixed white and black reference levels. This results in a high degree of precision of peak-to-peak video information from channel to channel within a block and from block to block in a block sequential multichannel video signal. It also eliminates the need for manual calibration of each of a plurality of video demodulators, eliminates block to block intensity shifts of a displayed frame and permits interchangeability of tapes between different multitrack video reproduction apparatus.

8 Claims, 7 Drawing Sheets

VIDEO REPRODUCTION APPARATUS HAVING AUTOMATIC BLACK AND WHITE CALIBRATION

BACKGROUND OF THE INVENTION

In general, this invention relates to video reproduction apparatus in which parallel channels of video information are recorded on multitrack magnetic tape as FM video signals. More particularly, this invention relates to a multitrack magnetic tape video reproduction apparatus wherein a plurality of demodulators which demodulate a plurality of channels of video information reproduced from magnetic tape are provided with auto calibration circuitry to effect constraint of the demodulated video signals within a range of fixed peak-to-peak, white-to-black reference levels.

Various techniques have been proposed for the motion analysis of an event such as to detect malfunctions in high speed machinery, to analyze movements of an athlete, to test safety equipment, to study the shattering of an object, etc. Multitrack magnetic tape reproduction devices have been especially useful in the motion analysis of such fast moving phenomena in slow motion. Such a motion analysis device is disclosed in commonly assigned U.S. Pat. No. 4,496,995, issued Jan. 29, 1985. As disclosed in this Patent, the motion analyzer entails the recording of a large number of images during an event at high tape speed and high frame rate and then playing back the images more slowly at a lower frame rate and lower tape speed to analyze the movement which has occurred in step by step progression. The motion analyzer includes a video imager (camera), a variable speed multitrack magnetic tape processor and a video display monitor. A scene to be analyzed is focused on the imager which is read out in block format so that a frame of video information is read out in a sequence of blocks of a plurality of channels of video information that correspond to rows of photosites in the imager. The parallel channels of video information in each block are simultaneously recorded on magnetic tape in longitudinal parallel tracks thereon as frequency modulated video information signals. Upon playback the plurality of FM video signals are played back simultaneously and converted into a sequential signal which is displayed on a video monitor.

Since a plurality of FM modulators and demodulators are used during the recording and reproducing of the parallel signals, it is desirable that each of the channels of reproduced video information matches to each other with respect to peak-to-peak, white-to-black video range so that there is uniformity of displayed signal intensity from line-to-line and from block-to-block. Although, ideally, the modulators and demodulators adhere to nominal specifications, some variation can be expected from the modulators and demodulators in each of the several channels. Thus, it has been the practice to provide manually adjustable trimmers in the modulator and demodulator circuits in order to effect calibration of the plurality of modulators and demodulators with respect to each other to produce uniformity in signal intensity of displayed images.

Moreover, although ideally magnetic tape should be moved past the reproducing head at a constant speed in order to accurately reproduce the video signals from the tape, in reality, severely degraded or totally incomprehensible displayed video information may result from variations in the speed of the tape, due to localized tape stretch, tape vibration, etc. This timing error (flutter) introduced into the video signal is undesirable.

SUMMARY OF THE INVENTION

According to the present invention, there is provided calibration technique for constraining reproduced video information between fixed peak-to-peak, white-to-black reference levels so that a displayed image has no intensity shifts over the area of the image. According to an aspect of the invention, a frequency modulated video signal is provided with a reference period with white and black reference level signals followed by a video period with video information signals. When reproduced from tape, the demodulated white and black reference level signals are compared with fixed white and black reference levels to effect correction of the white to black range of the video information signal during demodulation thereof.

According to an aspect of the invention, there is provided peak-to-peak signal correction in a multitrack magnetic tape video reproduction apparatus in which a frame of video information is recorded as a sequence of blocks of a plurality of parallel channels of video information on a plurality of longitudinal tracks on magnetic tape. The reproduction of the plurality of channels of video information is effected by a plurality of demodulators each of which has a white and black auto calibration circuit to effect a high degree of consistency in the peak-to-peak, white to black video range of each video channel so that a displayed image is free of intensity variations. By providing automatic calibration of each channel, manual trimmer adjustments of the modulators and demodulators are eliminated. Moreover, the auto calibration technique of the present invention allows interchangeability of tapes between different motion analysis systems.

According to another aspect of the present invention, the plurality of channels of video information reproduced from multitrack magnetic tape are corrected for flutter-induced variations in the video information signals so as to reduce image degradation which might be introduced by flutter.

BRIEF DESCRIPTION OF THE DRAWINGS

The invention will be described in detail with reference to the drawings in which like elements are provided with like numbers.

DESCRIPTION OF THE PREFERRED EMBODIMENT

In the following description, the preferred embodiment according to the present invention will be described as included in a motion analyzer which utilizes multi-track longitudinal recording of video signals and a timing signal. It will be understood, however, that the present invention may be used on recording media other than magnetic tape, such as magnetic or optical discs.

The application in which the embodiment of the present invention will be described relates to a motion analyzer which records scene information at a high frame rate and reproduces such information at a slower frame rate, thereby allowing slow motion analysis of a changing event, such as a moving object. The imager frame rate used for recording is variable between 30 and 1,000 frames per second depending upon the desired speed reduction while the display frame rate is constant at 30 frames per second. To effect this, the image frames are recorded at a high tape speed and reproduced at a low tape speed.

Figure 1:
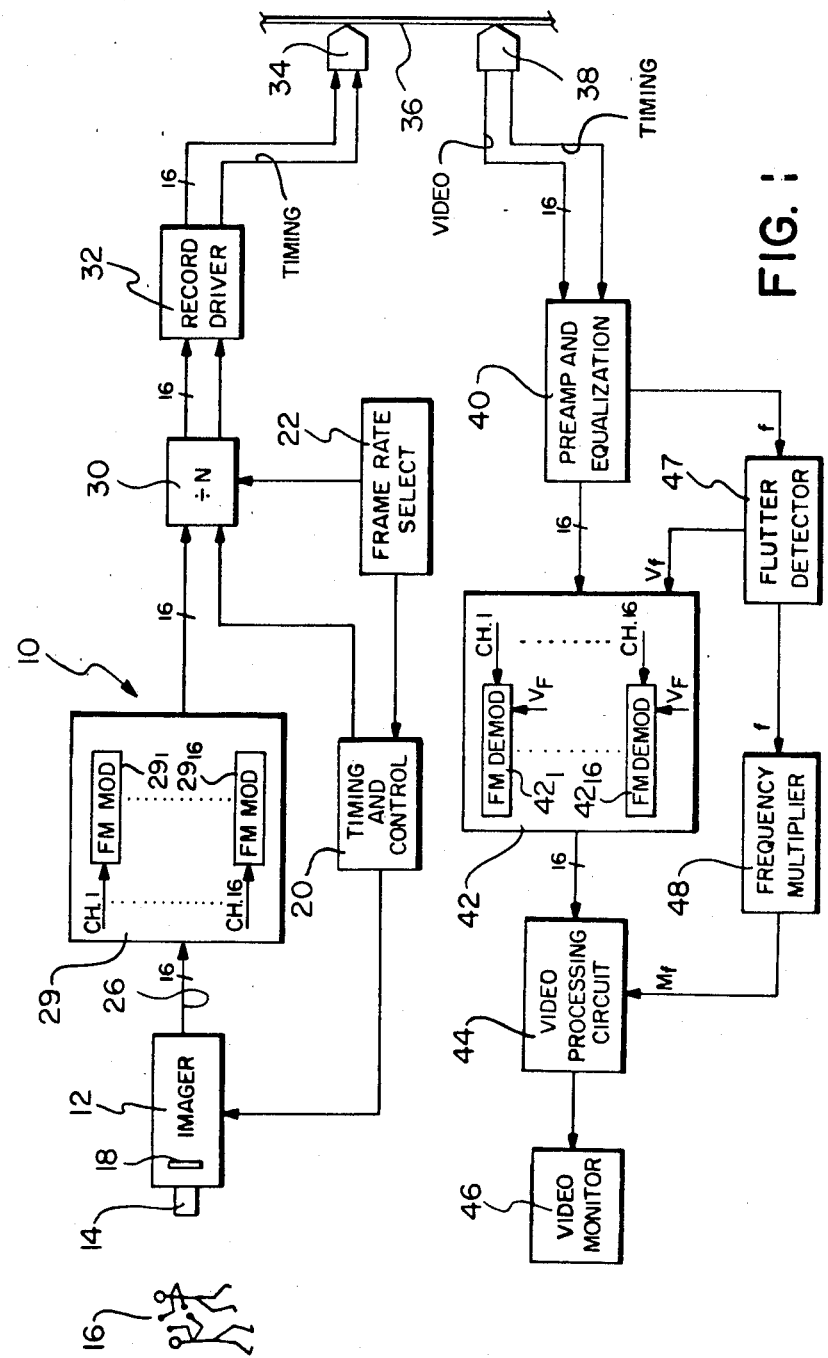
FIG. 1 is a block diagram of multi-track video reproduction apparatus including an embodiment of the present invention.

Referring to FIG. 1, there is shown a motion analyzer including an embodiment of the present invention. Such a motion analyzer is described in greater detail in commonly-assigned U.S. Pat. No. 4,496,995 and copending U.S. patent application Ser. No. 875,822, entitled SYNCHRONOUS FM DIGITAL DATA PROCESSOR, which are incorporated by reference. Briefly, the motion analyzer 10 includes an imager 12 having a lens 14 which images a scene 16 onto a sensor 18. Imager 12 is controlled by timing and control circuit 20 which supplies suitable timing signals to imager 12 as a function of the operator selectable frame rate and speed reduction entered into selector 22. Motion analyzer 10 may be operated at frame rates of 30, 60, 125, 250, 500, and 1000 frames per second for recording and at a frame rate of 30 frames per second for reproducing. In such case, the operator would select the appropriate frame rate by select circuit 22.

Figure 2:
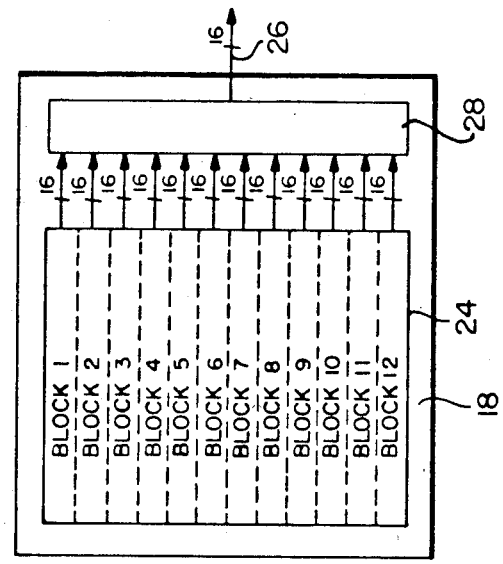
FIG. 2 is a functional block schematic diagram of a block readable imager.

Sensor 18 is a "block" readable area image sensor. The basic concept of a block readout of a solid state area image sensor is disclosed in U.S. Pat. No. 4,322,752 in the name of James A. Bixby and in U.S. Pat. Nos. 4,322,638 in the name of T. H. Lee et al and 4,330,796 in the names of C. N. Anagnostopoulos et al. Although the referenced patents provide detailed information, a brief description of the concept of block readout may be illustrated with respect to FIGS. 2 and 3a and 3b. FIG. 2 shows a block readable sensor 18 that includes an array of photosites (not shown individually) arranged in rows and columns (e.g. 192 rows and 240 columns). For purposes of readout, sensor 18 is formatted into 12 blocks of 16 photosite rows each. Although demarcation between blocks is indicated by dashed lines, it will be understood that no physical demarcation on the sensor itself is necessary. Through appropriate control circuitry, blocks 1-12 are sequentially read out of image area 24 of imager sensor 18 and applied to an output line 26 by means of block multiplexer 28. A a result of such readout, block information is produced in series and each block of information contains 16 row signals arranged in parallel.

Referring again to FIG. 1, each of the 16 channels of analog video signal from imager 12 is frequency modulated as square waves in FM modulator 29 on a carrier having a black level frequency of 4.166 MHz and a white level frequency of 6.66 MHz. FM modulator 29 includes sixteen modulators constituting a modulator for each channel, i.e. FM MOD 29, for video channel 1 to FM MOD $29_{16}$ for video channel 16. All 16 frequency modulated video signals are applied to a divide by N circuit 30 in which each frequency signal is divided by a factor of N. The value of "N" is equal (to the nearest integer) to the ratio of the maximum record frame rate to the selected record frame rate. Thus if the maximum frame rate is 1000 frames per second, and the selected record frame rate is 125 frames per second, then N would be equal to 8.

A timing signal from circuit 20 is also applied to circuit 30.

The 16 parallel FM video signals and a timing signal are applied to record driver circuit 32 which drives record head 34 to record the video signals in 16 parallel longitudinal tracks on tape 36. The timing signal is recorded simultaneously in a timing track which runs parallel to the video tracks. This is shown more clearly in FIG. 3 where the 16 row signals are recorded in video tracks 1-16 and the timing signal is recorded in a timing track which runs parallel to the video tracks between video track 8 and video track 9. As shown, the signals from each block are recorded sequentially on tape 36 so that a frame of information is recorded in the recording of the 16 lines of sequential blocks 1-12.

Figure 3B:
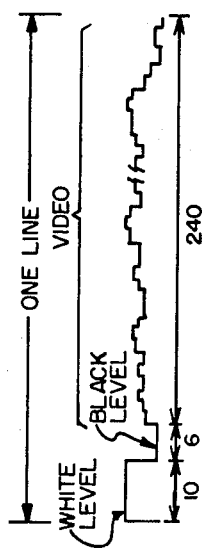
FIGS. 3a and 3b show the format of video signals and timing signal recorded on longitudinal, parallel tracks on magnetic tape.
Figure 3A:
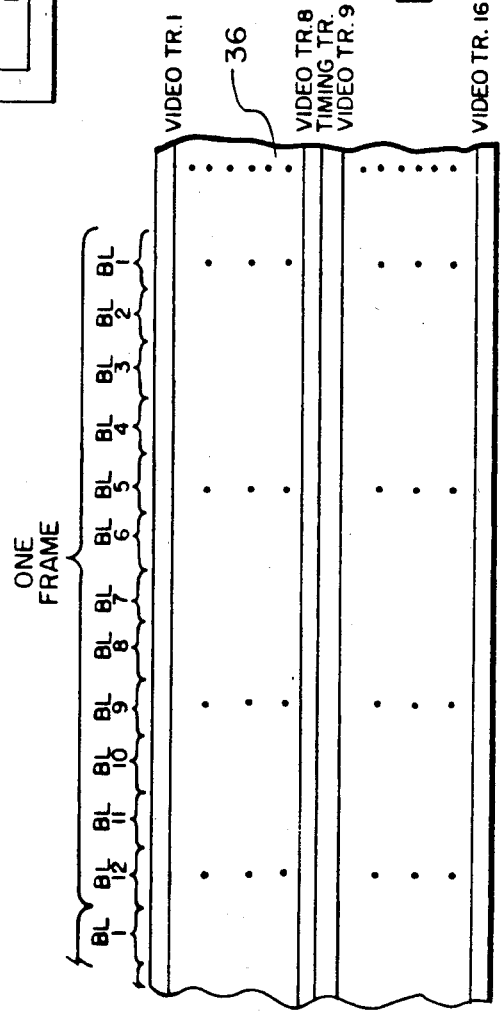

FIG. 3b shows each line of analog video signal as including a reference signal period of 16 pixel duration at the beginning of the line followed by a video signal period of 240 pixel duration. The reference signal period includes a white reference level signal of 10 pixel duration and a black reference level signal of 6 pixel duration.

Referring again to FIG. 1, during reproduction, tape 36 is moved past reproduce head 38 at a constant speed irrespective of the tape speed at which the data was recorded on the tape. Reproduce head 38 (as well as record head 34) has a plurality of heads equal in number to the number of tracks of video information and the timing signal track on tape 36. Thus, head 38 would have 17 closely spaced heads, 16 heads for reproducing square wave FM video signals from video tracks 1-16 and a head for reproducing the timing signal from the timing track. Tape 6 may have other tracks such as a data track, in which case heads 34 and 38 would have additional heads as needed.

The 16 channels of FM video signals and the timing signal are applied to circuit 40 which preamplifies and equalizes the signals according to known techniques. The 16 channels of FM video signals are applied to FM demodulation circuit 42 which comprises 16 FM demodulators ($42_1$–$42_{16}$) for individually demodulating each FM video signal into an analog video signal. The timing signal is applied to a timing signal processing circuit which may for example, take the form of the timing signal processing circuit described in copending commonly-assigned U.S. Patent Application Ser. No. 897,890, entitled TIMING SIGNAL DROPOUT COMPENSATION CIRCUIT, issued July 14, 1987, as U.S. Pat. No. 4,680,651. Briefly, such circuit includes flutter detector circuit 47 which produces a flutter control signal $V_F$ which is applied to FM demodulators $42_1$–$42_{16}$. The timing signal is multiplied in frequency multiplier circuit 48 to produce a signal Mf which is applied to video processing circuit 44. After demodulation, the 16 channels of reproduced analog video signals are applied to video processing circuit 44 along with appropriate timing signals to produce an NTSC video signal which is applied to video monitor 46 to reproduce the original scene. An exemplary form of video processing circuit 44 is described in the aforementioned copending U.S. patent application Ser. No. 875,822 and in U.S. Pat. 4,496,995 (FIG. 9).

Figure 4A:
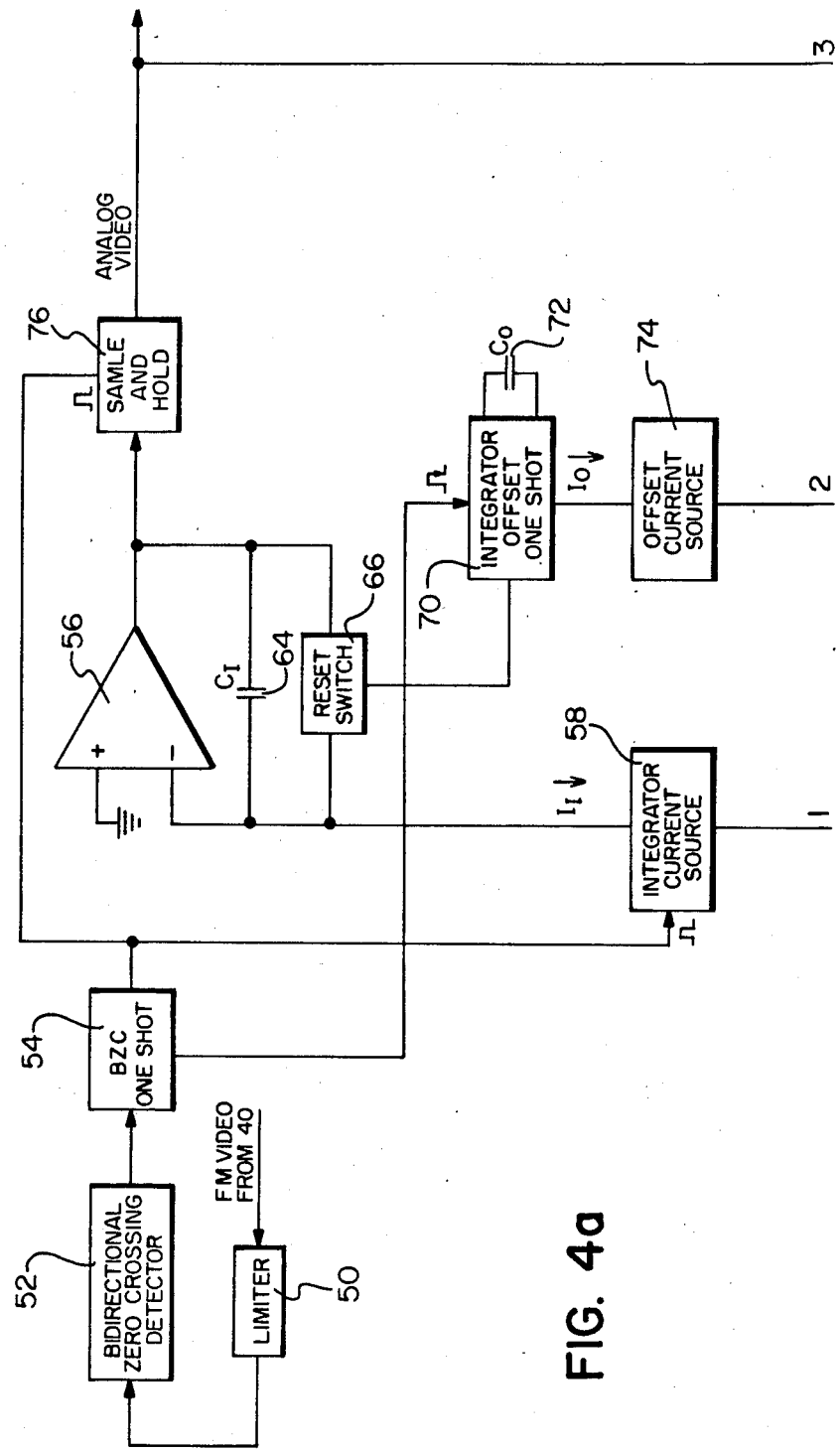
FIG. 4A and B is a block diagram showing an FM demodulator as used in the apparatus of FIG. 1.
Figure 4B:
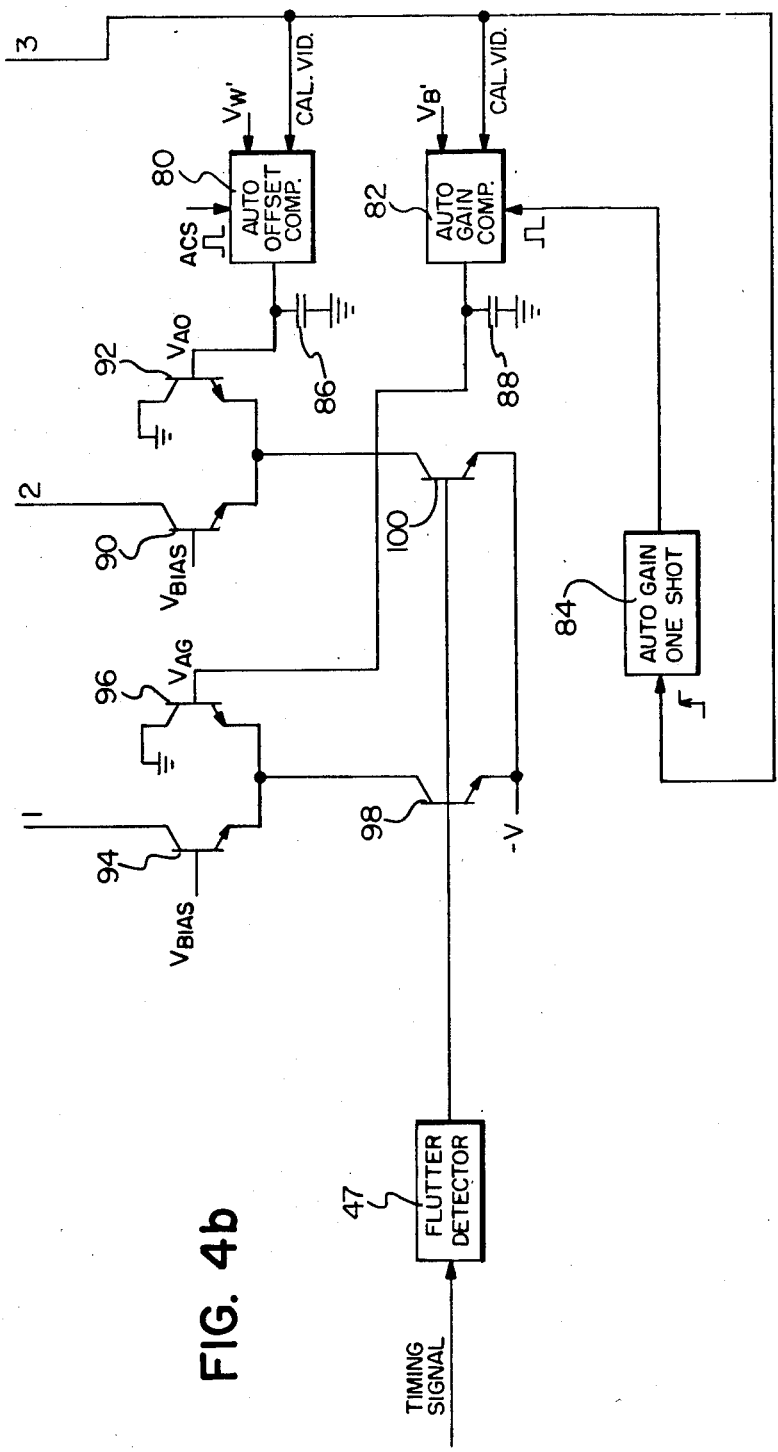

Referring now to FIG. 4A and B, there will be described a preferred embodiment of an FM demodulator having automatic white and black level calibration and flutter correction according to the present invention. The circuit shown in FIG. 4 is duplicated sixteen times in FM demodulator circuit 42 so that 16 channels of FM video signals from equalization circuit 40 are demodulated simultaneously to produce 16 parallel analog video signals.

If a properly reproduced frequency modulated video signal is demodulated, the recovered analog video signal will have a signal value which accurately reflects the intensity level of the original image. Certain errors may be introduced during modulation and demodulation of the analog video signal and during recording and reproducing of the FM video signal. These errors can cause intensity shifts in a reproduced image and can cause severe degradation of the reproduced image. If such errors are not corrected, the degraded image may appear at a critical time in a sequence of video frames during a motion analysis test, thus negating the test and causing undesirable and costly waste of equipment and personnel. One cause of error is due to flutter which results in timing error in the reproduced video information signals. Another cause of error is variations in operation in the 16 modulators and demodulators which result in image intensity shifts between lines of video within a block and from block-to-block.

The FM demodulator circuit of FIG. 4A and B is basically a period demodulation system in which the times between zero crossings of the FM video signal are representative of the original analog video signal before frequency modulation. Tape flutter error will cause the tape to momentarily speed up or slow down so that zero crossings are either too early or too late. Thus, in order to correct for the incorrect zero crossings, the recovered video signal must be compensated to eliminate the effect of flutter error. Additionally, although the white to black frequency range of the FM video signal is fixed, several percent variation of the FM modulators in each channel can be expected. Thus, FM variations are introduced into the FM video signals which introduce inaccurate image intensity shifts. Although manual calibration of each video processing channel may be effected, such is undesirable and automatic calibration is essential to effect compatibility from motion analyzer to motion analyzer.

Since the simultaneously reproduced video signals and timing signal contain the same flutter error component, according to a feature of the present invention, flutter error is corrected by developing a flutter correction signal from the timing signal and by applying the correction signal to the FM demodulators to cancel flutter error components from the demodulated video signals. According to an aspect of the invention, a single flutter compensation signal is derived from the reproduced timing signal to effect flutter correction in each of the FM demodulators. This simplifies the flutter error correction circuitry so that an individual flutter detection circuit for each FM demodulator is unnecessary.

In order to correct intensity shift errors introduced during the modulation process, white and black reference levels are added at the beginning of each line of video information. During demodulation, the reproduced white-and-black reference level signals are compared to fixed white and black reference levels and error signals produced which are applied to the demodulators during demodulation of the video signal to constrain each reproduced analog video signal between the fixed white and black reference levels.

Figure 5A:
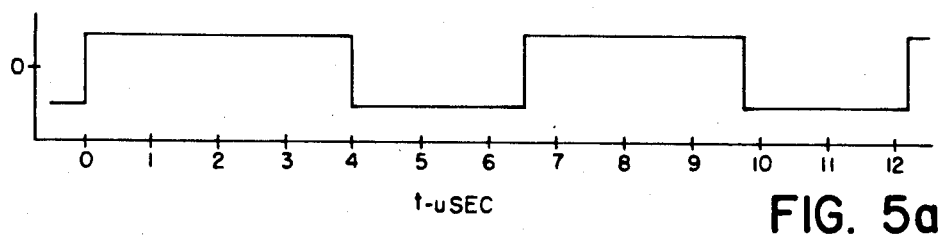
FIGS. 5a–5e are waveform diagrams illustrating the operation of the FM demodulator of FIG. 4.

Referring again to FIG. 4A and B, the square wave FM video signal from circuit 40 is limited by limiter 50 and is then applied to bi-directional zero crossing detector 52. At each zero crossing of the FM signal (FIG. 5a), detector 52 produces an output signal which is applied to a one-shot multivibrator 54 (BZC one-shot) to produce a series of sample pulses having a period $T_S$ (see FIG. 5c).

Figure 6A:
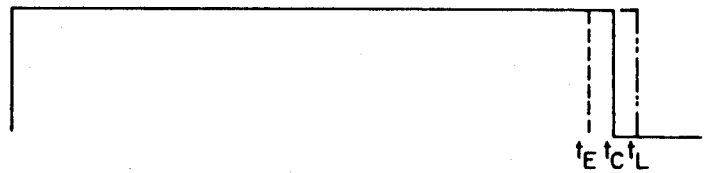
FIGS. 6a and 6b are waveform diagrams illustrating the flutter correction technique of the present invention.
Figure 6B:
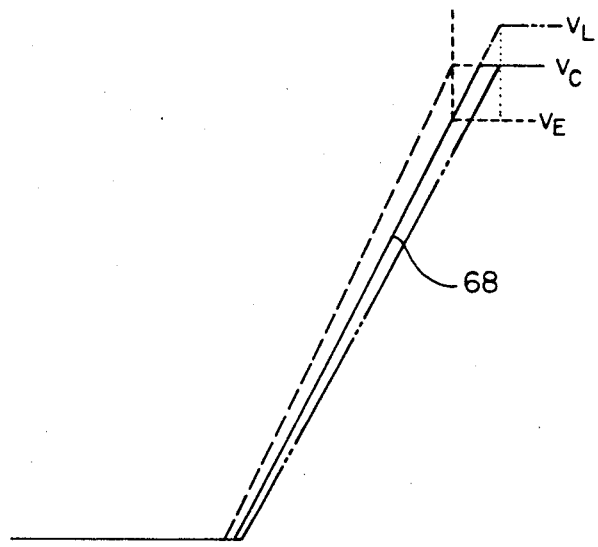

An integrator circuit includes an operational amplifier 56 having its positive input 59 connected to ground and its negative input 60 connected to an integrator current source 58 of known construction (such as a current mirror or the like). Connected between the negative input 60 of output 62 and op-amp 56 are an integrating capacitor 64 of capacitance $C_I$ and a reset switch 66. Integrator current source 58 provides a constant current $I_I$ to the negative input of op-amp 56. During the integration period, integrator capacitor 64 charges at an integration rate or slope $I_I/C_I$, (which is illustrated in FIG. 6b as ramp curve 68).

Reset switch 66 is controlled by reset pulses (FIG. 5d) from integrator offset one-shot 70 which produces a reset pulse having a period determined by the value $C_0$ of one-shot timing capacitor 72 which has a timing period $T_0$ determined by offset current $I_0$ provided by offset current source 74.

The output 62 is sampled by sample and hold circuit 76 whose output is an analog video signal.

If there are no flutter errors or black-to-white intensity range errors present in the reproduced FM video signal, demodulation thereof is effected by the circuit of FIG. 4A and B as follows. Assume that it has been some time since a zero crossing of the FM video signal and integrating capacitor 64 is charging up by means of current $I_I$ supplied by integrator current source 58. At the next zero crossing at a time $t_0$ (FIG. 5a), detector 52 produces a trigger signal which actuates one-shot multivibrator 54 to produce a sample pulse which is applied to sample and hold circuit 76 and to integrator current source 58. The sample pulse (FIG. 5c) is of a duration $T_S$ and causes current source 58 to be turned off so that integration current to integrating capacitor 64 is terminated. For the period $T_S$, the output voltage on capacitor 64 is held and is sampled and stored by sample and hold circuit 76. This voltage will vary as a function of the time between zero crossings of the FM signal and thus is representative of the original analog video signal before frequency modulation and recording on tape 36.

Figure 5B:
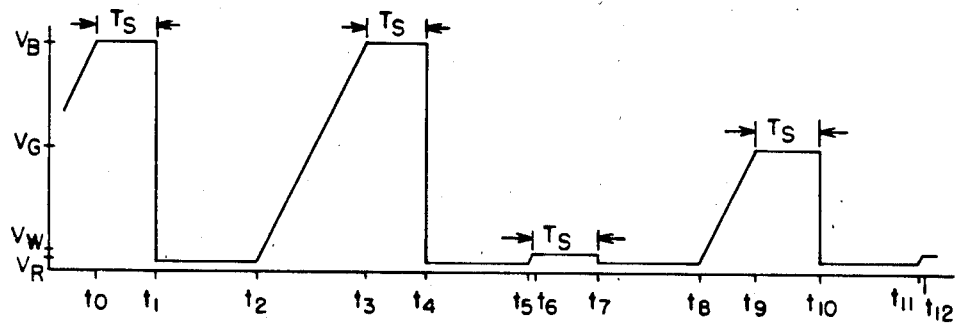
Figure 5C:
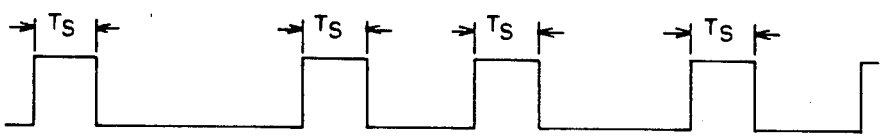
Figure 5D:
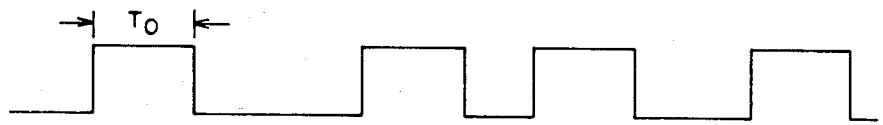
Figure 5E:
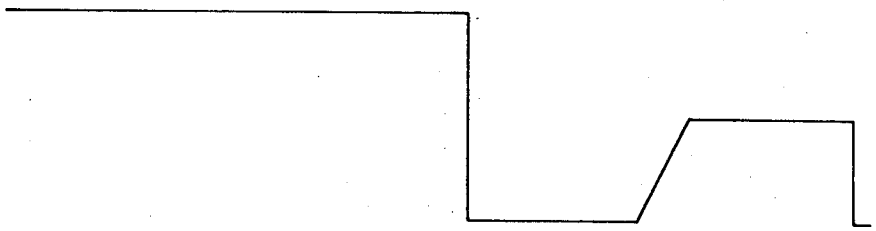

As shown in FIG. 5b, the value of the integrator output voltage at time $t_0$ is $V_B$ which is sampled by sample and hold circuit 76 and presented at the output thereof (see FIG. 5e).

At time $t_1$, at the end of the sample pulse period $T_S$, the falling edge of a reset pulse (produced by one-shot multivibrator 54 simultaneously with the sample pulse) causes integrator offset one-shot multivibrator 70 to produce a reset pulse (FIG. 5d) having a duration $T_0$. The period $T_O$ is a function of the offset current $I_0$ supplied by offset current source 74 to offset one-shot multivibrator timing capacitor 72 and the capacitance $C_0$ thereof ($T_O = I_O/C_O$).

The reset switch 66 is turned on during the reset period and discharges integrating capacitor 64. At this time also, the sampled pulse has terminated and integration current source 58 is turned on, but since reset switch 66 is held on by a reset pulse from one-shot multivibrator 70, no integration of capacitor 64 takes place. During the reset period $T_0$, output 62 of the integrator is held at reset voltage $V_R$ (see FIG. 5b) which is below the limit of the video signal demodulation range.

The sum of the sample period $T_S$ and the offset period $T_O$ is made equal to slightly less than the half period of the highest FM frequency, nominally 2.4 usec for the 210 KHz signal used for the white limit of the video signal.

At the end of the offset period at time $t_2$ (FIGS. 5b, 5d), the reset pulse returns to zero and reset switch 66 is turned off, allowing integration current supplied by current source 58 to charge integrating capacitor 64. Capacitor 64 continues to integrate until a subsequent zero crossing of the FM video signal is detected by detector 52. As shown in FIGS. 5a and 5b the first half wave of the FM signal extends from time $t_0$ to time $t_3$ (4 usec) and is a half-wave of the lowest FM frequency signal, i.e. 125 KHz which is representative of a black image pixel. At time $t_3$, BZC one-shot multi-vibrator 54 produces a sample pulse of duration $T_S$ (FIG. 5c) which shuts off the integration current source 58 and terminates charging of integrating capacitor 64. From time $t_3$ to $t_4$, the voltage at output 62 is sampled by sample and hold circuit 76. At time $t_4$, the falling edge of the sample pulse triggers offset one-shot 70 to produce a reset pulse which closes reset switch 66. Capacitor 64 is discharged and the output 62 of the integrator is held at a voltage $V_R$ during the reset period. At time $t_5$, the reset switch 66 is turned off by the termination of the reset pulse and capacitor 64 begins to charge. However, a zero crossing of the FM video signal at time $t_6$ (FIG. 5a) stops integration at the $V_W$ (white) signal level and the sample and hold circuit 76 samples the voltage and applies it as an output analog video signal. The FM video waveform (FIG. 5a) from time $t_3$ to time $t_6$ between zero crossings is representative of the highest FM modulation video signal having a frequency of 210 KHz and is representative of the white signal limit of the analog video signal.

Subsequent zero crossings of the FM video signal (FIG. 5a) at time $t_9$ and $t_{12}$ produce the output waveform of FIG. 5b at output terminal 62 of the integrator and the demodulated analog video signal of FIG. 5e at the output of sample and hold circuit 76. It will be appreciated that the analog video signal of FIG. 5e is inverted so that the highest signal value represents a black image and the lowest signal value represents a white image.

According to one feature of the present invention, each reproduced FM video signal is automatically calibrated during demodulation so as to constrain each channel (line) of reproduced analog video signal to fixed white and black reference levels. In general, this is effected by providing white and black reference level signals at the beginning of each line of video signals. During the demodulation process, the reproduced white and black level reference signals are demodulated before the video information signals and compared to fixed white and black reference level signals. Any differences between the compared reference levels produce respective white and black correction signals which are applied to the demodulator during demodulation of the video information signal to constrain the reproduced analog video signal between the fixed white and black level signals.

Figure 7A:
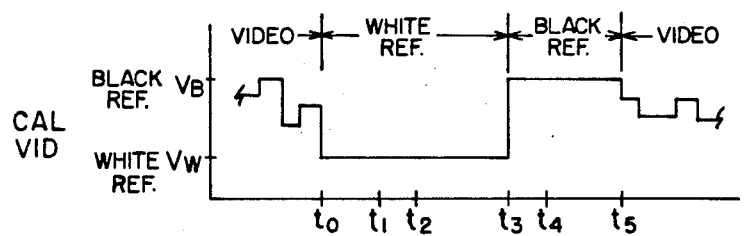
FIG. 7a–7d are waveform diagrams illustrating the auto calibration technique of the present invention.

Referring again to FIG. 4A and B and also to FIGS. 7a–7d, there is shown an embodiment of auto-calibration circuit according to the present invention as incorporated in demodulator 42. The auto calibration circuit includes auto-offset comparison circuit 80, auto-gain comparison circuit 82, auto-gain one-shot multivibrator 84, auto-offset capacitor 86, auto-gain capacitor 88, and transistor pairs 90, 92, and 94, 96. Transistors 98 and 100 will be described later with respect to the flutter compensation technique of the present invention. As shown in FIG. 7a, the first portion of the demodulated video signal includes a white reference period with a duration from time $t_0$ to $t_3$ and a black reference period with a duration from time $t_3$ to $t_5$. The white reference period has a white reference level $V_W$ and the black reference period has a black reference $V_B$. It will be appreciated that, due to the modulation frequencies assigned to white and black and the use of a period demodulation scheme, that the white and black reference signals are reversed in value from the signal shown in FIG. 3b. The reference period from $t_0$ to $t_5$ of the demodulated video signal is labelled as "CAL VID". The "CAL VID" signal is applied as one input to both automatic offset comparator circuit 80 and automatic gain comparator circuit 82. Also applied to circuit 80 is a fixed white reference level $V_W$, and applied to comparison circuit 82 is a fixed black reference level $V_B'$. During the white reference period from time $t_0$ to $t_3$, a ACS pulse of duration from $t_1$ to $t_2$ actuates comparison circuit 80 to compare the reproduced white reference level of the video signal with the fixed white reference level. If there is a difference between $V_W$ and $V_W'$, then a white error correction signal is produced which is stored on capacitor 86 as a voltage $V_{AO}$ which is applied to the base of transistor 92. Any change in the bias voltage on the base of transistor 92 will change the current $I_0$ flowing through transistor 90, which has a fixed bias $V_{BIAS}$ applied to its base. A change in $I_0$ will change the timing of the integrator offset one shot multivibrator pulse applied to reset switch 66 and thus increase or decrease the time $t_0$ that reset switch 66 discharges capacitor 64.

Figure 7B:
Figure 7C:
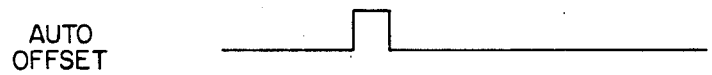
Figure 7D:
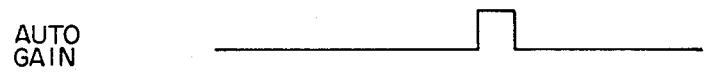

The ACS pulse is shown in FIG. 7b and may be produced by any suitable circuit, such as a one shot multivibrator or the like as a delayed pulse triggered by the detection of the beginning of the white reference level period at time $t_0$. The auto effect comparator on time is represented in FIG. 7c and labelled "Auto Offset". The ACS and auto offset pulses have a duration from time $t_1$ to $t_2$ well within the white reference period of $t_0$ to $t_3$.

At time $T_3$ (FIG. 7a), there is a transition from the white reference level to the black reference level. This white-to-black transition activates auto-gain, one-shot multivibrator 84 which produces a pulse (AUTO-GAIN—see FIG. 7d) which has a duration from time $t_3$ to $t_4$. During this period, the auto-gain comparison circuit 82 is active and compares the reproduced black reference level signal $V_B$ of the CAL VID signal to the fixed black reference level $V_B'$. If there is any difference in the two compared signals, a black correction signal is produced which is stored on capacitor 88 and which appears as a correction signal $V_{AG}$ which is applied as a bias to the base of transistor 96. Transistor 96 controls the current $I_I$ which flows through transistor 94 which is biased by a voltage $V_{BIAS}$. Any correction voltage changes the integration current $I_I$ in order to change the slope of the integration ramp signal.

As an example, if one of the modulators 29 in a specific channel, for example modulator $29_1$ in channel 1, should produce a frequency modulated signal which is several percent greater than the nominal frequency signals, all zero crossings will be shortened and the reproduced reference signals $V_W$ and $V_B$ will be reduced in value. Thus, when these reproduced reference signals are compared with the fixed reference signals, white and black correction signal will be used to increase $I_I$ and $I_0$ so as to increase the gain of the integrator and decrease the time that reset switch 66 is on. Thus, the demodulated analog video signal will be accurately constrained between $V_W$, and $V_B'$.

Conversely, if modulator $29_1$ decreases the modulation frequencies of $V_W$ and $V_B$, then all zero crossings will be late and the reproduced reference signals will be too large. In such case, during the comparison periods, the white-and-black correction signal will cause currents $I_I$ and $I_0$ to decrease, thus increasing the gain of the integrator ramp signal and the on time of reset switch 66.

According to another feature of the present invention, there is provided a technique for reducing any flutter error which may be introduced into the FM video signal reproduced from magnetic tape 36. Flutter error correction is combined with the black-and-white level correction described above. However, as disclosed in commonly-assigned, copending U.S. patent application Ser. No. 897,889, entitled FM VIDEO DEMODULATION WITH FLUTTER CORRECTION, flutter correction may also be effected in a period demodulator if the circuit is calibrated manually or by other techniques.

Since the FM video signals and the timing signal are recorded on magnetic tape 36 simultaneously, and also reproduced from magnetic tape 36 simultaneously, any flutter error which is introduced into the video signal upon reproduction will also be present in the simultaneously reproduced timing signal. Thus, the flutter error in the timing signal is effectively the same as the flutter error in the video signals particularly since the timing signal is recorded in a track running down the middle of the tape. The timing signal from the timing track is applied to a flutter detector circuit 78 which may, for example, take the form of the similar circuit disclosed in copending U.S. application Ser. No. 897,890, entitled TIMING SIGNAL DROPOUT COMPENSATION CIRCUIT, issued July 14, 1987, as U.S. Pat. No. 4,680,651. As disclosed therein, a phase lock loop continuously tracks the timing signal reproduced from the tape and detects any shift in the frequency of the timing signal produced by flutter. The flutter correction signal $V_F$ is applied to the bases of transistors 98 and 100 which respectively change the integration and offset currents $I_I$ and $I_0$ supplied to integration capacitor 64 and offset capacitor 72. If the flutter is such as to increase the frequency of the timing signal and thus the frequencies of the FM video signals, the zero crossings will occur sooner than expected, thus, in general, causing a reduction in the reproduced analog video signal. If the flutter error causes the tape to slow down so that the frequency of the FM signals and of the timing signal are decreased in frequency, then the zero crossings will occur later in time than expected, causing an increase in reproduced analog video signal. These inaccuracies in the reproduced analog video signal will obscure or severely degrade the reproduced image displayed on the video monitor.

If there is a momentary increase in tape speed so as to increase the frequencies of the FM video signal and of the timing signal, the flutter circuit will produce a correction signal $V_F$ which biases transistors 98 and 100 to increase current $I_I$ and current $I_0$, so as to increase the gain or slope of the integration ramp signal and to decrease the "on" time of reset switch 66. This is shown more clearly in FIGS. 6a and 6b. In FIG. 6a, the reproduced FM video signal without flutter is shown (in solid line) as having a zero crossing at time $t_C$ and the integration curve (FIG. 6b) reaches a correct value of $V_C$. If the tape should speed up so that the zero crossing of the FM video signal is sooner (at a time $t_E$), integration will stop at signal level $V_E$ which is less than the correct signal level $V_C$. If on the other hand, the tape should slow down during reproduction, the zero crossing of the FM video signal will occur later (at a time $t_L$) and the demodulated video signal will have a value $V_L$ which is greater than the correct signal $V_C$.

The flutter detector 47 will produce a bias voltage $V_F$ which is applied to transistors 98 and 100 to increase the integration current $I_I$ and offset current $I_0$ so as to increase the slope or gain of the integration signal and to decrease the offset time by decreasing the offset period $T_0$ of the reset pulse produced by integrator offset one-shot multivibrator 70. This is shown in FIG. 6b wherein the dashed line integration curve is shown to have a greater slope (gain) than the solid line integration curve and to start integration at an earlier time since the offset time has been decreased. Thus when the FM signal has a zero crossing at $t_E$, the integration curve has reached the correct value $V_C$ and will be sampled by sample and hold circuit 76 to produce a correct output analog video signal.

If flutter in the tape produces a late zero crossing of the FM video signal, then the flutter correction signal produced by circuit 78 causes the integration and offset currents ($I_I$ and $I_0$) to decrease so that the integration curve (shown in dotted lines in FIG. 6b) has a lesser slope (gain) and the offset period is increased. When the late zero crossing at time $t_L$ occurs, integration of integrating capacitor 64 is terminated at the correct voltage level $V_C$ so that the analog video signal has the correct value.

Although the invention has been described in detail with reference to preferred embodiments thereof, it will be understood that variations and modifications can be effected within the spirit and scope of the invention as described hereinabove and as defined in the appended claims.

What is claimed:

1. A demodulator for a frequency modulated (FM) video signal comprising;
   means for reproducing an FM video signal from recording media;
   integrator means for producing a ramp signal which varies substantially linearly over a predetermined integration period between first and second signal levels representing intensity limits of a scene;
   sample and hold means for sampling and holding the signal level produced by said integrator means;
   detector means for detecting the zero crossings of said reproduced FM video signal and for producing a pulse of fixed sampling period which terminates production of said ramp signal by said integrator means and which causes said sample and hold means to sample said integrator means signal level and to hold said sampled signal level after termination of said sampling pulse;

switch means for resetting the signal level of said integrator means to a reset level less than said first signal level and for maintaining said reset signal level for a predetermined offset period;

means for comparing first and second reference signal levels of said demodulated reproduced video signal with respective fixed first and second reference signal levels and for producing a first signal level correction signal for changing the slope of said ramp signal and a second signal level correction signal for changing the duration of said offset period as a function of differences in the compared reproduced reference video signal levels and said fixed reference levels so as to constrain said demodulated video signal between said fixed first and second signal levels.

2. The demodulator of claim 1 wherein said integrator means includes an integrating capacitor and an integrating current source means for supplying an integrating current to said capacitor and wherein said first signal level correction signal changes said integrating current to said integrating capacitor to constrain said demodulated video signal to said first signal level.

3. The demodulator of claim 1 including means for producing a reset signal, which actuates said switch means for the offset period of said reset signal, said reset signal producing means including an offset period timing capacitor and an offset current source means for supplying an offset current to said capacitor and wherein said second signal level correction signal changes said offset current to said offset period timing capacitor to change said offset period so as to constrain said demodulated video signal to said second signal level.

4. The demodulator of claim 1 wherein said reproducing means simultaneously reproduces from recording media both an FM video signal and a timing signal which are subject to corresponding flutter error components, and includes means for producing a flutter correction signal from said timing signal, and further includes means for applying said flutter correction signal (1) to said integrator means to change the slope of said ramp signal, and (2) to said switch means to change the duration of said offset period to cancel said flutter error in said demodulated video signal.

5. A multitrack magnetic tape video reproduction apparatus comprising: means for reading out an area imager in sequential blocks of a plurality of parallel channels of analog video information signals wherein each channel of video signal includes a reference period with white-and-black reference level signals followed by a video period with video information signals;

a plurality of frequency modulator means for converting said plurality of analog video information signals into a plurality of frequency modulated video information signals;

means for recording blocks of said plurality of frequency modulated video information signals on a plurality of parallel longitudinal tracks on magnetic tape so that a frame of video information is recorded in sequential blocks on said tape;

means for simultaneously reproducing a plurality of parallel channels of FM video information signals from said magnetic tape;

a plurality of FM demodulator means for demodulating said plurality of reproduced FM video information signals into a plurality of analog video information signals;

wherein each of said plurality of FM demodulator means includes (a) integrator means for producing a ramp signal which varies substantially linearly over a predetermined integration period between first and second signal levels representing intensity limits of a scene;

(b) sample and hold means for sampling and holding the signal level produced by said integrator means;

(c) detector means for detecting the zero crossings of said reproduced FM video signal and for producing a pulse of fixed sampling period which terminates production of said ramp signal by said integrator means and which causes said sample and hold means to sample said integrator means signal level and to hold said sampled signal level after termination of said sampling pulse;

(d) switch means for resetting the signal level of said integrator means for a reset level less than said first signal level and for maintaining said reset signal level for a predetermined offset period;

(e) means for comparing first and second reference signal levels of said demodulated reproduced video signal with respective fixed first and second reference signal levels and for producing a first signal level correction signal for changing the slope of said ramp signal and a second signal level correction signal for changing the duration of said offset period as a function of differences in the compared reproduced reference video signal levels and said fixed reference levels so as to constrain said demodulated video signal between said fixed first and second signal levels; and wherein said reproduction apparatus further includes means for displaying said plurality of demodulated analog video information signals such that the white-to-black range of the displayed image is uniform.

6. The apparatus of claim 5 wherein, in each of said demodulator means, said integrator means includes an integrating capacitor and an integrating current source means for supplying an integrating current to said capacitor and wherein said first signal level correction signal changes said integrating current to said integrating capacitor to constrain said demodulated video signal to said first signal level.

7. The apparatus of claim 5 wherein, each of said demodulator means includes means for producing a reset signal, which actuates said switch means for the offset period of said reset signal, said reset signal producing means including an offset period timing capacitor and an offset current source means for supplying an offset current to said capacitor; and wherein said second signal level correction signal changes said offset current to said offset period timing capacitor to change said offset period so as to constrain said demodulated video signal to said second signal level.

8. The apparatus of claim 5 wherein said reproducing means simultaneously reproduces from said magnetic tape both said plurality of channels of FM video information signals and a timing signal, said video information signals and said timing signal being subject to corresponding flutter error components;

wherein said apparatus includes means for producing a flutter correction signal from said timing signal and means for applying said flutter correction signal to each of said demodulator means to change the slope of said ramp signal produced by said integrator means and to change the duration of said offset period of said switch means so as to cancel any flutter error in said demodulated video signal.

* * * * *